United States Patent
Minnen et al.

(10) Patent No.: US 11,177,823 B2
(45) Date of Patent: Nov. 16, 2021

(54) DATA COMPRESSION BY LOCAL ENTROPY ENCODING

(71) Applicant: Google LLC, Mountain View, CA (US)

(72) Inventors: David Charles Minnen, Mountain View, CA (US); Michele Covell, Woodside, CA (US); Saurabh Singh, Mountain View, CA (US); Sung Jin Hwang, Mountain View, CA (US); George Dan Toderici, Mountain View, CA (US)

(73) Assignee: Google LLC, Mountain View, CA (US)

( * ) Notice: Subject to any disclaimer, the term of this patent is extended or adjusted under 35 U.S.C. 154(b) by 486 days.

(21) Appl. No.: 15/985,340

(22) Filed: May 21, 2018

(65) Prior Publication Data
US 2019/0356330 A1 Nov. 21, 2019

(51) Int. Cl.
*H04N 19/91* (2014.01)
*H03M 7/30* (2006.01)
(Continued)

(52) U.S. Cl.
CPC ...... *H03M 7/3088* (2013.01); *G06F 16/2365* (2019.01); *G06F 16/285* (2019.01);
(Continued)

(58) Field of Classification Search
CPC .... G06T 9/00–007; H03M 7/30–6064; H03M 7/00–55; H04N 19/91
See application file for complete search history.

(56) References Cited

U.S. PATENT DOCUMENTS 5,872,599 A * 2/1999 Rosenbrg ............... H04N 19/60
341/106
9,698,819 B1 * 7/2017 Baranchik ............. H03M 7/405
(Continued)

FOREIGN PATENT DOCUMENTS

WO WO 2013/011495 1/2013

OTHER PUBLICATIONS

'Bellard.org' [online] "BPG image format," Apr. 21, 2018, [retrieved on Sep. 24, 2018] Retrieved from Internet: URL<http://bellard.org/bpg/> 2 pages.
(Continued)

*Primary Examiner* — Robert W Beausoliel, Jr.
*Assistant Examiner* — Nirav K Khakhar
(74) *Attorney, Agent, or Firm* — Fish & Richardson P.C.

(57) ABSTRACT

Methods, systems, and apparatus, including computer programs encoded on a computer storage medium, for compressing and decompressing data. In one aspect, an encoder neural network processes data to generate an output including a representation of the data as an ordered collection of code symbols. The ordered collection of code symbols is entropy encoded using one or more code symbol probability distributions. A compressed representation of the data is determined based on the entropy encoded representation of the collection of code symbols and data indicating the code symbol probability distributions used to entropy encode the collection of code symbols. In another aspect, a compressed representation of the data is decoded to determine the collection of code symbols representing the data. A reconstruction of the data is determined by processing the collection of code symbols by a decoder neural network.

20 Claims, 6 Drawing Sheets

(51) Int. Cl.
*H04N 19/13* (2014.01)
*H04N 19/192* (2014.01)
*G06F 16/28* (2019.01)
*G06F 16/23* (2019.01)
*G06N 3/08* (2006.01)
*G06N 7/00* (2006.01)

(52) U.S. Cl.
CPC ............... *G06N 3/08* (2013.01); *G06N 7/005* (2013.01); *H04N 19/13* (2014.11); *H04N 19/192* (2014.11); *H04N 19/91* (2014.11)

(56) References Cited

U.S. PATENT DOCUMENTS

| | | | | |
|---|---|---|---|---|
| 9,774,856 | B1 | 9/2017 | Mukherjee | |
| 2002/0141422 | A1* | 10/2002 | Hu | H03M 7/40 370/408 |
| 2003/0048208 | A1* | 3/2003 | Karczewicz | H04N 19/61 341/67 |
| 2013/0230096 | A1* | 9/2013 | Lasserre | H04N 19/19 375/240.02 |
| 2016/0204795 | A1* | 7/2016 | Huang | H03M 7/30 341/87 |
| 2016/0292589 | A1* | 10/2016 | Taylor, Jr. | G06F 16/1744 |
| 2017/0230675 | A1 | 8/2017 | Wierstra et al. | |

OTHER PUBLICATIONS

'developers.google.com' [online] "WebP: Compression techniques," Last updated: Dec. 21, 2016, [retrieved on Sep. 24, 2018] Retrieved from Internet: URL<http://developers.google.com/speed/webp/docs/compression> 9 pages.

'r0k.US' [online] "Kodak lossless true color image suite" Last updated: Jan. 27, 2013, [retrieved on Sep. 24, 2018] Retrieved from Internet: URL<http://r0k.us/graphics/kodak/> 4 pages.

Agustsson et al. "Soft-to-hard vector quantization for end-to-end learning compressible representations," NIPS, Dec. 2017, 11 pages.

Arthur et al. "K-means++: The advantages of careful seeding," Society for Industrial and applied Mathematics, Jan. 2007, 11 pages.

Asuni et al. "TESTIMAGES: A large scale archive for testing visual devices and basic image processing algorithms (SAMPLING 1200RGB set)." STAG: Smart Tools and Apps for Graphics Conference, Sep. 2014, 8 pages.

Balle et al. "End-to-end optimized image compression," arXiv 1611.01704v3, Mar. 3, 2017, 27 pages.

Deutsch. "DEFLATE compressed data format specification," version, 1.3, United States, May 1996, [retrieved on Sep. 24, 2018] Retrieved from Internet: URL< https://www.ietf.org/rfc/rfc1951.txt> 16 pages.

Johnston et al. "Improved lossy image compression with priming and spatially adaptive bit rates for recurrent networks," arXiv 1703.10114, Mar. 29, 2017, 9 pages.

Li et al. "Learning convolutional networks for content-weighted image compression," arXiv 1703.10553v2, Sep. 19, 2017, 11 pages.

Minnen et al. "Spatially adaptive image compression using a tiled deep network," International Conference on Image Processing, Sep. 2017, 5 pages.

Rippel et al. "Real-time adaptive image compression," arXiv 1705.05823, May 16, 2017, 16 pages.

Theis et al. "Lossy image compression with compressive autoencoders," arXiv 1703.00395, Mar. 1, 2017, 19 pages.

Toderici et al. "Full resolution image compression with recurrent neural networks," arXiv 1608.05148v2, Jul. 7, 2017, 9 pages.

Toderici et al. Variable rate image compression with recurrent neural networks, arXiv 1511.06085v5, Mar. 1, 2016, 12 pages.

Wang et al. "Multiscale structural similarity for image quality assessment," The 37th Asilmoar Conference on Signals, Systems and Computers, Nov. 2003, 5 pages.

PCT International Preliminary Report on Patentability in International Application PCT/US2019/032374, dated Dec. 3, 2020, 10 pages.

\* cited by examiner

DATA COMPRESSION BY LOCAL ENTROPY ENCODING

BACKGROUND

This specification relates to data compression.

Compressing data refers to determining a representation of the data that occupies less space in a memory. Compressed data may be stored (e.g., in a logical data storage area or physical data storage device), transmitted to a destination over a communications network (e.g., the Internet), or used in any other manner. Generally, the data can be reconstructed (either approximately or exactly) from the compressed representation of the data.

SUMMARY

This specification describes systems implemented as computer programs on one or more computers in one or more locations that perform data compression and data decompression.

According to a first aspect there is provided a system for compressing data. The system includes an encoder neural network configured to receive data to be compressed, and to process the data in accordance with current values of a set of encoder neural network parameters. The encoder neural network generates an output including a representation of the data as an ordered collection of code symbols.

The system also includes a compression subsystem which is configured to receive the output of the encoder neural network, including the representation of the data as an ordered collection of code symbols. A partition of the collection of code symbols into one or more code symbol subsets is identified. For each code symbol subset, a code symbol probability distribution for the code symbol subset is identified based on the code symbol subset and from a dictionary of multiple code symbol probability distributions. An entropy encoded representation of each code symbol subset is generated by entropy encoding the code symbol subset using the code symbol probability distribution identified for the code symbol subset. A compressed representation of each code symbol subset is determined, which includes: (i) the entropy encoded representation of the code symbol subset, and (ii) data indicating a code symbol probability distribution used to entropy encode the code symbol subset. A compressed representation of the data is determined based on the compressed representations of the code symbol subsets.

In some implementations, the data to be compressed includes an image.

In some implementations, the encoder neural network is a convolutional neural network.

In some implementations, the system includes a learning subsystem which is configured to process data in a set of training data by the encoder neural network and in accordance with the current values of the set of encoder neural network parameters. Representations of the data in the set of training data as ordered collections of code symbols are generated. For each ordered collection of code symbols, a partition of the ordered collection of code symbols into one or more code symbol subsets is identified. The dictionary of multiple code symbol probability distributions is determined based on distributions of code symbols in the code symbol subsets of the ordered collections of code symbols.

In some implementations, determining the dictionary of code symbol probability distributions includes determining, for each of the code symbol subsets of the ordered collections of code symbols, a respective code symbol probability distribution. For each of the code symbol subsets, the code symbol probability distribution reflects a frequency of occurrence of code symbols in the code symbol subset. The determined code symbol probability distributions are clustered. The dictionary of code symbol probability distributions is determined based on cluster centers of the clustered code symbol probability distributions.

In some implementations, clustering the code symbol probability distributions includes determining a distance between code symbol probability distributions based on a divergence measure.

In some implementations, identifying a code symbol probability distribution for the code symbol subset includes determining, for each code symbol probability distribution in the dictionary, a corresponding length of an entropy encoded representation of the code symbol subset based on the code symbol probability distribution. The code symbol probability distribution for the code symbol subset is identified to be a code symbol probability distribution from the dictionary with a minimal corresponding length of entropy encoded representation.

In some implementations, determining the length of an entropy encoded representation of the code symbol subset based on the code symbol probability distribution includes determining a sum, over each code symbol in the code symbol subset, of a logarithm of a probability of the code symbol according to the code symbol probability distribution.

In some implementations, one or more code symbol subsets are determined to be candidate code symbol subsets. A custom code symbol probability distribution is determined based on the candidate code symbol subsets. A savings value is determined based on a reduction in a length of entropy encoded representations of the candidate code symbol subsets achieved by entropy encoding the candidate code symbol subsets using the custom code symbol probability distribution instead of code symbol probability distributions from the dictionary. A cost value is determined based on a length of data required to represent the custom code symbol probability distribution. In response to determining that the savings value is greater than the cost value, the entropy encoded representations of the code symbols of the candidate code symbol subsets are generated by entropy encoding the candidate code symbol subsets using the custom code symbol probability distribution.

In some implementations, identifying a partition of the collection of code symbols into one or more code symbol subsets includes identifying a partition of the collection of code symbols into multiple different proper subsets.

According to a second aspect there is provided a system for decompressing data. The system is configured to receive a compressed representation of data including a compressed representation of each of one or more code symbol subsets of an ordered collection of code symbols representing the data. The compressed representation of each code symbol subset includes: (i) an entropy encoded representation of the code symbol subset, and (ii) data indicating a code symbol probability distribution used to entropy encode the code symbol subset. Each code symbol subset is determined by decoding the entropy encoded representation of the code symbol subset based on the code symbol probability distribution used to entropy encode the code symbol subset. A representation of the data as an ordered collection of code symbols is determined based on the code symbol subsets.

The system also includes a decoder neural network. The decoder neural network is configured to receive the representation of the data as an ordered collection of code symbols. The ordered collection of code symbols is processed by the decoder neural network and in accordance with current values of a set of decoder neural network parameters to generate an output defining a reconstruction of the data.

In some implementations, the data indicating a code symbol probability distribution used to entropy encode the code symbol subset includes data indicating a code symbol probability distribution from a dictionary of code symbol probability distributions.

In some implementations, the data indicating a code symbol probability distribution used to entropy encode the code symbol subset includes data defining a respective numerical probability value for each code symbol in a set of possible code symbols.

According to a third aspect there is provided a non-transitory computer readable storage medium storing instructions executable by a data processing apparatus and that upon such execution causes the data processing apparatus to perform the operations of the previously described systems.

According to a fourth aspect there is provided a computer-implemented method that performs the operations of the previously described systems.

Particular embodiments of the subject matter described in this specification can be implemented so as to realize one or more of the following advantages.

The encoding system as described in this specification may compress data more efficiently than some conventional systems by generating compressed data representations that occupy less memory than compressed data representations generated by conventional systems.

For example, the encoding system as described in this specification can partition an ordered collection of code symbols representing the data into subsets, and entropy encode each subset by a respective local code symbol probability distribution. In contrast, some conventional systems entropy encode the ordered collection of code symbols representing the data by a global code symbol probability distribution that may be unrepresentative of the actual frequency of occurrence of different code symbols in the ordered collection of code symbols. By entropy encoding different subsets of the ordered collection of code symbols using different local code symbol probability distributions, rather than a single global code symbol probability distribution, the encoding system as described in this specification can compress data more efficiently than some conventional systems.

As another example, unlike some conventional systems, the encoding system as described in this specification can perform entropy encoding using custom code symbol probability distributions that are determined from the data being compressed (rather than being learned from training data), when doing so would result in more efficient entropy encoding. Therefore, the encoding system as described in this specification can compress data more efficiently than some conventional systems which perform entropy encoding using only generic code symbol probability distributions that are not determined from the data being compressed. This may be particularly beneficial in the context of the use of an encoder or decoder neural network, in which a representation of data may be obtained in a non-linear manner which is not derived from rigid analysis and which may be variable according to a training status of the neural network.

By compressing data more efficiently than conventional systems, the encoding system as described in this specification may enable more efficient data transmission (e.g., by reducing the communications network bandwidth required to transmit data) and more efficient data storage (e.g., by reducing the amount of memory required to store data). Moreover, through the disclosed approach improved efficiency may be achieved without compromising data quality and/or authenticity. These are technical improvements in the field of data compression.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

The technology described in this specification is related to an encoding system that performs data compression. The data to be compressed can be image data, video data, or any other type of data. The encoding system generates (e.g., by an encoder neural network) a representation of the data as an ordered collection of code symbols (e.g., integer values). The encoding system identifies a partition of the ordered collection of code symbols representing the data into one or more code symbol subsets. For example, the ordered collection of code symbols may be a matrix, and the partition may be a "tiling" of the matrix into regularly spaced rectangular subsets. The encoding system can entropy encode (e.g., by Huffman coding) each code symbol subset using a respective code symbol probability distribution from a dictionary of code symbol probability distributions that is learned from a set of training data. The encoding system can determine the compressed representation of the data based on: (i) the entropy encoded representations of the code symbol subsets, and (ii) data indicating the respective code symbol probability distributions used to entropy encode the code symbol subsets.

In some cases, the encoding system may determine that a more efficient (i.e., smaller) compressed representation of the data can be achieved by entropy encoding one or more code symbol subsets using custom code symbol probability distributions learned directly from the data to be compressed. In these cases, the encoding system may entropy encode one or more of the code symbol subsets using a custom code symbol probability distribution.

This specification also describes a decoding system that is configured to process the compressed data representations generated by the encoding system to generate (approximate or exact) reconstructions of the data. These features and other features are described in more detail later.

Figure 1:
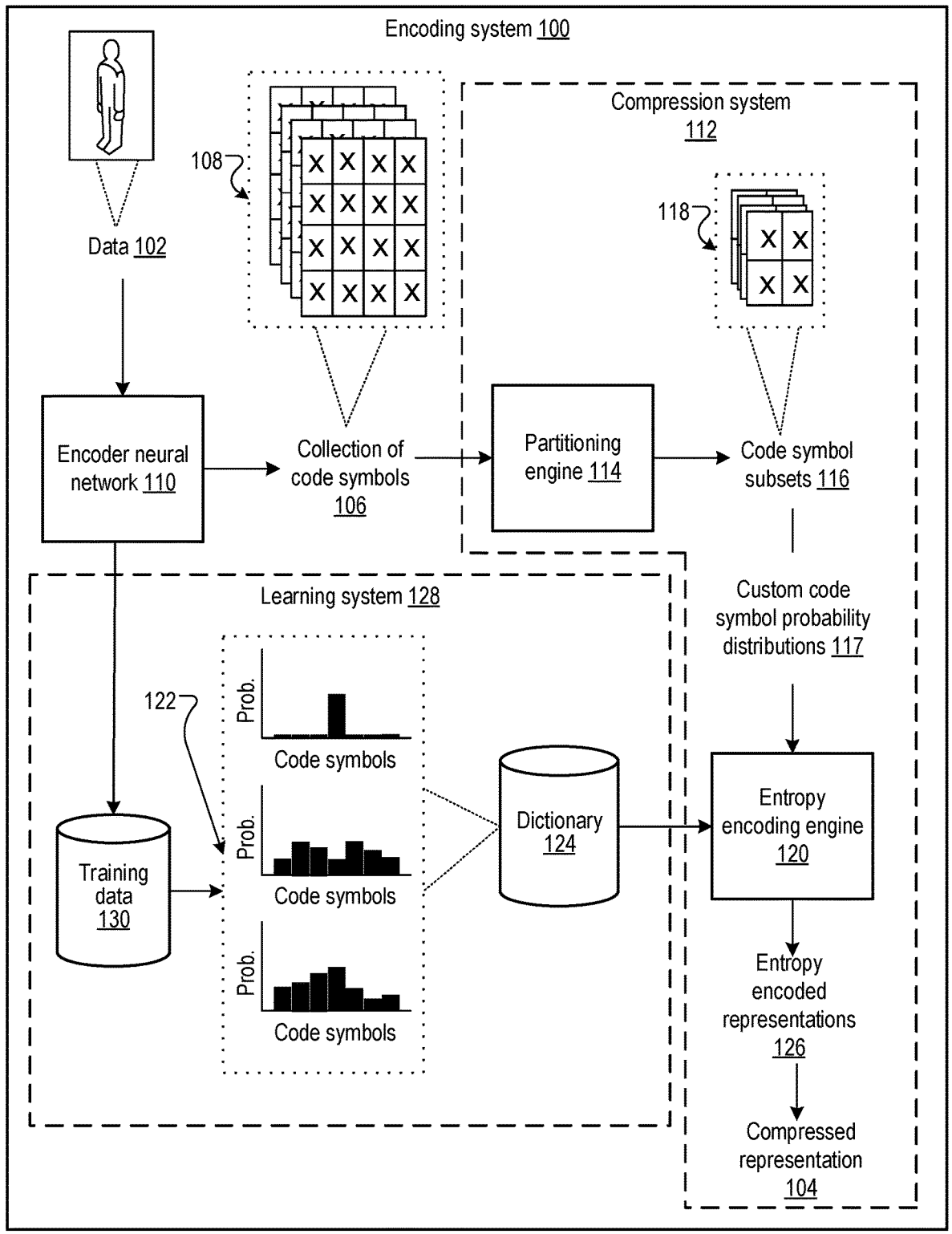
FIG. 1 is a block diagram of an example encoding system.

FIG. 1 is a block diagram of an example encoding system 100. The encoding system 100 is an example of a system implemented as computer programs on one or more computers in one or more locations in which the systems, components, and techniques described below are implemented.

The encoding system 100 processes data 102 to generate as output a compressed representation 104 of the data 102. The compressed representation 104 may occupy less memory (e.g., in a logical data storage area or physical data storage device) than the data 102. The data 102 may be image data, audio data, video data, or any other form of data. Generally, the compressed representation 104 contains information characterizing the data 102 so as to enable a decoding system 200 to process the compressed representation 104 to generate an (approximate or exact) the reconstruction of the data 102 (as described further with reference to FIG. 2).

The encoding system 100 determines a representation of the data 102 as an ordered collection of code symbols 106. The code symbols are members of a discrete set of possible code symbols. For example, the possible code symbols may be numerical symbols (e.g., integer values), alphabetical symbols (e.g., from the English alphabet), or symbols from any other discrete set. The ordered collection of code symbols 106 may be represented as a vector of code symbols, a (multi-dimensional) matrix of code symbols (e.g., as depicted in 108), or in any other appropriate manner.

The encoding system 100 can determine the collection of code symbols 106 by any appropriate means. For example, the encoding system 100 may determine the collection of code symbols 106 as the coefficients of a representation of the data 102 with respect to a set of basis functions (e.g., the Fourier basis). As another example, the encoding system 100 may determine the collection of code symbols 106 by providing a numerical representation of the data 102 as an input to an encoder neural network 110. The encoder neural network 110 is configured to process the input in accordance with current values of encoder neural network parameters to generate as output the collection of code symbols 106 (as will be described further with reference to FIG. 3). The encoder neural network 110 may be a feed-forward neural network, a recurrent neural network, or any other appropriate neural network implementation. The encoder neural network 110 may include fully-connected layers, convolutional layers, or any appropriate neural network layers.

In a particular example, the data 102 may be an image, and the encoder neural network 110 may be a convolutional neural network. In this example, the collection of code symbols 106 may be a three-dimensional (3D) matrix C of code symbols (e.g., as depicted in 108). The 3D matrix of code symbols C may be indexed by x, y, and z coordinates. In this specification, the two-dimensional (2D) set of code symbols $C(\bullet,\bullet,z)$ corresponding to any particular z coordinate is referred to as a channel of the collection of code symbols 106. That is, the channel of the 3D matrix C corresponding to coordinate z is given by:

$$C(\bullet,\bullet,z)=\{C(x,y,z): \text{for every } x \text{ coordinate and every } y \text{ coordinate}\} \quad (1)$$

The encoding system 100 provides the collection of code symbols 106 to a compression system 112, which processes the collection of code symbols 106 to generate the compressed representation 104 of the data 102.

The compression system 112 provides the collection of code symbols 106 as an input to a partitioning engine 114. The partitioning engine 114 is configured to identify a partition of the collection of code symbols 106 into one or more code symbol subsets 116. That is, the partitioning engine 114 divides the collection of code symbols 106 into one or more disjoint parts, each of which is referred to as a code symbol subset 116.

In a particular example, when the collection of code symbols 106 is a 3D matrix of code symbols (e.g., as depicted in 108), the partitioning engine 114 may identify the code symbol subsets 116 by partitioning each channel of the 3D matrix of code symbols (as described earlier) into regularly spaced rectangular blocks. As depicted in 118, each channel of the 3D matrix of code symbols may be partitioned into 2×2 code symbol subsets 116 (or, more generally, code symbol subsets of any appropriate dimensionality). Other n×n code symbol subsets can also be used, e.g., 4×4, for example.

The compression system 112 provides each code symbol subset 116 to an entropy encoding engine 120. For each code symbol subset 116, the entropy encoding engine 120 identifies a respective code symbol probability distribution (e.g., one of the three code symbol probability distributions depicted in 122) from a dictionary 124 (i.e., a set) of code symbol probability distributions. A code symbol probability distribution refers to data indicating a respective numerical probability value for each code symbol in the discrete set of possible code symbols. As will be described further with reference to FIG. 3, for a given code symbol subset 116, the entropy encoding engine 120 may identify the code symbol probability distribution from the dictionary 124 that enables the given code symbol subset 116 be most efficiently entropy encoded.

For each code symbol subset 116, after identifying a code symbol probability distribution for the code symbol subset 116 from the dictionary 124, the entropy encoding engine 120 generates an entropy encoded representation 126 of the code symbol subset 116 using the identified code symbol probability distribution. The entropy encoding engine 120 may generate the respective entropy encoded representation 126 of each code symbol subset 116 by any appropriate entropy encoding algorithm, such as Huffman coding or arithmetic coding. An entropy encoding algorithm is a method for lossless compression of a set of code symbols conditioned on a probability distribution over the set of code symbols. The entropy encoded representations 126 may be represented in any appropriate format. For example, the entropy encoded representations 126 may be numerically represented as binary data.

After generating an entropy encoded representation 126 of each code symbol subset 116, the compression system 112 determines a compressed representation of the data 102. The compressed representation 104 of the data 102 may include a compressed representation of each code symbol subset 116. The compressed representation of each code symbol subset 116 may include: (i) the entropy encoded representation 126 of the code symbol subset 116, and (ii) data indicating the code symbol probability distribution that was used by the entropy encoding engine 120 to entropy encode the code symbol subset 116. For example, if the code symbol probability distributions in the dictionary 124 are indexed by natural numbers (e.g., 1, 2, 3, . . . ), then the data indicating which code symbol probability distribution was used to entropy encode the code symbol subset 116 may be the index of the appropriate code symbol probability distribution. The compressed representation 104 may be represented in any appropriate format. For example, the compressed representation 104 may be numerically represented as binary data.

The encoding system 100 includes a learning system 128 that determines the code symbol probability distributions in the dictionary 124 from a set of training data 130. In general, the training data 130 includes data of the same type as the data 102 to be compressed. For example, if the data 102 is image data then the training data 130 may include multiple images. As will be described further with reference to FIG. 4, the learning system 128 can process the training data 130 by the encoder neural network 110 to generate representations of the training data as ordered collections of code symbols. After determining ordered collections of code symbols representing the training data 130, the learning system 128 can partition the ordered collections of code symbols into code symbol subsets and determine a set of code symbol probability distributions representing the frequency of occurrence of code symbols in the code symbol subsets. Next, the learning system 128 can cluster the set of code symbol probability distributions to determine a fixed number of representative code symbol probability distributions to be included in the dictionary 124.

The code symbol probability distributions in the dictionary 124 are determined from the training data 130 and are representative of the frequency of occurrence of code symbols in typical code symbol subsets 116. In some cases, the frequency of occurrence of code symbols in one or more code symbol subsets 116 of the collection of code symbols 106 representing the data 102 are not well represented by the code symbol probability distributions in the dictionary 124. In these cases, as will be described further with reference to FIG. 5, the encoding system 100 may determine one or more custom code symbol probability distributions 117 based on the code symbol subsets 116 representing the data 102. The entropy encoding engine 120 may use the custom code symbol probability distributions 117 to entropy encode one or more of the code symbol subsets 116.

After the encoding system 100 determines the compressed representation 104 of the data 102, the compressed representation 104 may be stored (e.g., in a logical data storage area or physical data storage device), transmitted to a destination over a communications network (e.g., the Internet), or used in any other manner. The data 102 can be reconstructed (either approximately or exactly) from the compressed representation 104 by a decoding system 200, as will be described further with reference to FIG. 2.

Figure 2:
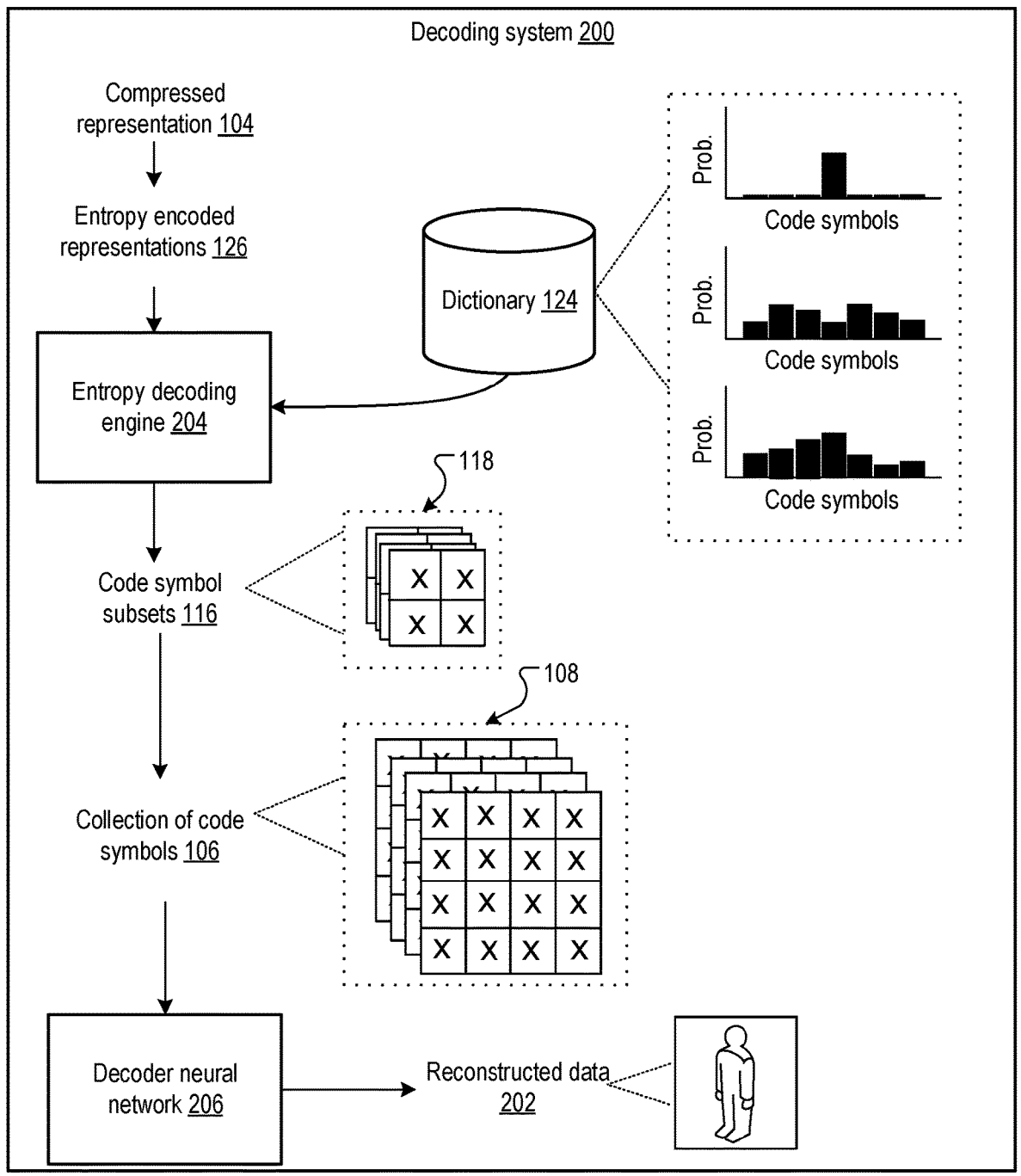
FIG. 2 is a block diagram of an example decoding system.

FIG. 2 is a block diagram of an example decoding system 200. The decoding system 200 is an example of a system implemented as computer programs on one or more computers in one or more locations in which the systems, components, and techniques described below are implemented.

The decoding system 200 processes the compressed representation 104 of the data 102 (e.g., as generated by the encoding system 100 as described with reference to FIG. 1) to generate as output reconstructed data 202 that is an (approximate or exact) reconstruction of the data 102. As described previously, the compressed representation 104 may include a compressed representation of each of the one or more code symbol subsets 116 of the collection of code symbols 106 representing the data 102. The compressed representation of a code symbol subset 116 may include: (i) an entropy encoded representation 126 of the code symbol subset 116, and (ii) data indicating the code symbol probability distribution used to entropy encode the code symbol subset 116.

The encoding system 100 and the decoding system 200 share the dictionary 124 of code symbol probability distributions. When the code symbol probability distribution used to entropy encode a code symbol subset 116 is a custom code symbol probability distribution (as described with reference to FIG. 1), the compressed representation 104 includes data which defines the custom code symbol probability distribution. For example, the compressed representation 104 may include a vector with components that indicate a respective numerical probability value for each code symbol in the discrete set of possible code symbols according to the custom code symbol probability distribution.

The decoding system 200 provides the entropy encoded representations 126 of the code symbol subsets 116 to an entropy decoding engine 204. The entropy decoding engine 204 is configured to determine the code symbol subsets 116 by decoding the entropy encoded representation 126 of each code symbol subset 116 based on the code symbol probability distribution used to entropy encode the code symbol subset 116. For example, conditioned on the code symbol probability distribution used to entropy encode a code symbol subset 116, the entropy decoding engine 204 may determine a mapping between portions of the entropy encoded representation 126 of the code symbol subset 116 and corresponding code symbols. The entropy decoding engine 204 may use this mapping to determine a code symbol subset 116 from the entropy encoded representation 126 of the code symbol subset 116.

The decoding system 200 determines the ordered collection of code symbols 106 representing the data 102 from the code symbol subsets 116. For example, the decoding system 200 may concatenate the code symbol subsets 116 to determine the ordered collection of code symbols 106 representing the data 102.

The decoding system 200 determines reconstructed data 202 that is an (approximate or exact) reconstruction of the data 102 based on the ordered collection of code symbols 106. For example, the encoding system 100 may have determined the ordered collection of code symbols 106 as the coefficients of a representation of the data 102 with respect to a set of basis functions (e.g., the Fourier basis). In this example, the decoding system 200 may determine the reconstructed data 202 as a linear combination of the basis functions with coefficients given by the collection of code symbols 106. As another example, if the encoding system 100 determined the ordered collection of code symbols 106 as the output of an encoder neural network 110, then the decoding system 200 may determine the reconstructed data 202 by providing the collection of code symbols 106 as an input to a decoder neural network 206. The decoder neural network 206 is configured to process the collection of code symbols 106 in accordance with current values of decoder neural network parameters to generate an output that defines the reconstructed data 202. In a particular example, if the encoder neural network 110 is a convolutional neural network, then the decoder neural network 206 may be a corresponding de-convolutional neural network.

Figure 3:
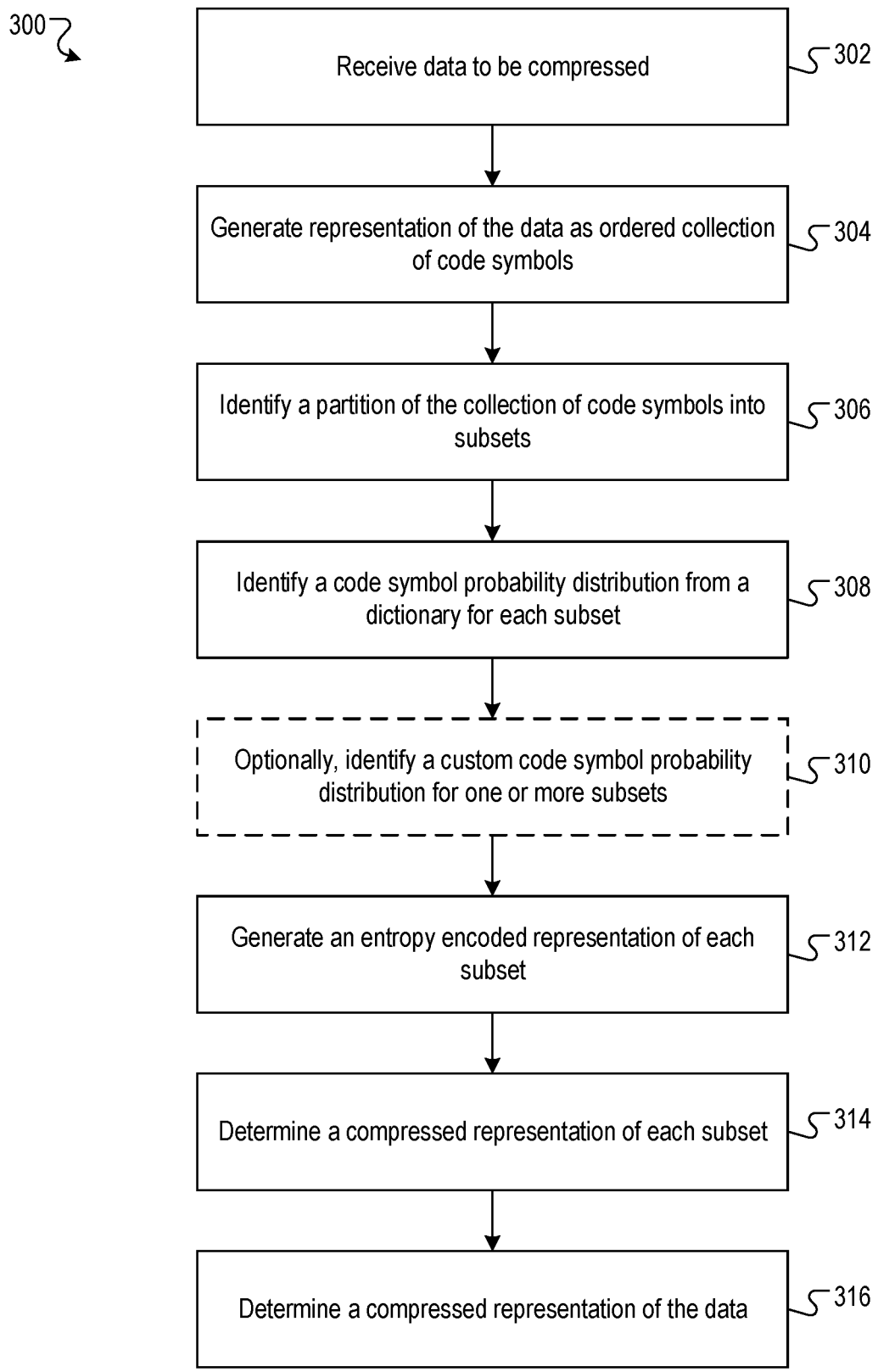
FIG. 3 is a flow diagram of an example process for determining a compressed representation of data.

FIG. 3 is a flow diagram of an example process for determining a compressed representation of data. For convenience, the process 300 will be described as being performed by a system of one or more computers located in one or more locations. For example, an encoding system, e.g., the encoding system 100 of FIG. 1, appropriately programmed in accordance with this specification, can perform the process 300.

The system receives data to be compressed (302). The data may be image data, audio data, video data, or any other form of data. For example, the data may be an I-frame, a P-frame, or a B-frame from video data. An I-frame refers to an image representing a frame in a video. A P-frame refers to data representing a residual (i.e., a difference) between an image representing a frame in a video and a prediction for the image representing the frame based on previous frames in the video. A B-frame refers to data representing a residual between an image representing a frame in a video and a prediction for the image representing the frame based on previous frames and subsequent frames. As another example, the data may be feature data derived from images or videos. As another example, the data may be 3D-mesh data. As another example, the data may be light field data (i.e., photographic data from multiple cameras).

The system generates a representation of the data as an ordered collection of code symbols (304). The code symbols are members of a discrete set of possible code symbols. For example, the possible code symbols may be numerical symbols (e.g., integer values), alphabetical symbols (e.g., from the English alphabet), or symbols from any other discrete set. The ordered collection of code symbols may be represented as a vector of code symbols, a (multi-dimensional) matrix of code symbols, or in any other appropriate manner.

The system can generate the collection of code symbols by any appropriate means. For example, the system may determine the coefficients of a set of basis functions (e.g., Fourier basis functions) that represent the data, and generate the collection of code symbols by quantizing the coefficients to integer values within a bounded range.

As another example, the system may generate the collection of code symbols by providing a numerical representation of the data as an input to an encoder neural network. For example, if the data is image data, the system may provide a numerical representation of the image data as a matrix of numerical values representing pixel colors/intensities to the encoder neural network.

The encoder neural network processes the input in accordance with current values of encoder neural network parameters to generate an output that defines the collection of code symbols. The system may determine the collection of code symbols by quantizing the output of the encoder neural network to integer values within a bounded range. The encoder neural network may be a feed-forward neural network, a recurrent neural network, or any other appropriate neural network implementation. The encoder neural network may include fully-connected layers, convolutional layers, or any appropriate neural network layers.

The system identifies a partition of the collection of code symbols into one or more code symbol subsets (306). For example, when the collection of code symbols is a 3D matrix of code symbols, the system may identify the code symbol subsets by partitioning each channel of the 3D matrix of code symbols into regularly spaced rectangular blocks.

For each code symbol subset, the system identifies a respective code symbol probability distribution from a dictionary of code symbol probability distributions (308). A code symbol probability distribution refers to data indicating a respective numerical probability value for each code symbol in the discrete set of possible code symbols. The dictionary of code symbol probability distributions is described further with reference to FIG. 4.

For a given code symbol subset, the system may identify a corresponding code symbol probability distribution by determining, for each code symbol probability distribution in the dictionary, a corresponding numerical score. For a given code symbol probability distribution in the dictionary, the score may be a corresponding length (e.g., measured in bits) of an entropy encoded representation of the code symbol subset determined using the code symbol probability distribution. For example, for each code symbol probability distribution p in the dictionary, the system may determine the score as the optimal length L of an entropy encoded representation of the code symbol subset determined using the code symbol probability distribution p, by:

$$L = -\sum_{j=1}^{n} \log p(c_j) \quad (2)$$

where n is the number of code symbols in the code symbol subset and $p(c_j)$ is the probability of the j-th code symbol in the code symbol subset according to the code symbol probability distribution p.

The system may identify the code symbol probability distribution for the given code symbol subset based on the determined scores of the code symbol probability distributions in the dictionary. For example, for the given code symbol subset, the system may identify the code symbol probability distribution in the dictionary with the lowest corresponding score. That is, in this example, the system may identify the code symbol probability distribution in the dictionary that enables the code symbol subset to be most efficiently entropy encoded.

Optionally, for one or more code symbol subsets, the system identifies a custom code symbol probability distribution based on a frequency of occurrence of code symbols in the code symbol subsets (310). An example process for identifying a custom code symbol probability distribution for one or more code symbol subsets is described with reference to FIG. 5.

The system generates an entropy encoded representation of each code symbol subset (312). More specifically, for each code symbol subset, the system determines an entropy encoded representation of the code symbol subset by entropy encoding the code symbol subset using the code symbol probability distribution identified for the code symbol subset (e.g., as described in 308 and 310). The code symbol probability distribution used to entropy encode a code symbol subset may be a code symbol probability distribution from the dictionary, or in some cases, a custom code symbol probability distribution (e.g., as described with reference to 310). The system may entropy encode the code symbol subsets by any appropriate entropy encoding algorithm, such as Huffman coding, arithmetic coding, or range coding. The entropy encoded representations of the code symbol subsets may be represented in any appropriate format. For example, the entropy encoded representations may be numerically represented as binary data.

The system determines a compressed representation of each code symbol subset (314). The compressed representation of each code symbol subset may include: (i) the entropy encoded representation of the code symbol subset (e.g., as described with reference to 312), and (ii) data indicating which code symbol probability distribution was used to entropy encode the code symbol subset. For example, if the code symbol probability distributions in the dictionary are indexed by natural numbers (e.g., 1, 2, 3, . . . ), then the data indicating which code symbol probability distribution was used to entropy encode the code symbol subset may be the index of the code symbol subset in the dictionary. As another example, if the code symbol probability distribution used to entropy encode the code symbol subset is a custom code symbol probability distribution, then the data indicating the custom code symbol probability distribution may include a respective custom probability value for each code symbol in the discrete set of possible code symbols.

The system determines a compressed representation of the data (316). The system may determine the compressed representation of the data based on: (i) the compressed representation of each code symbol subset (e.g., as described with reference to 314), and (ii) representations of any custom code symbol probability distributions used to entropy encode any of the code symbol subsets. The compressed representation of the data may be represented in any appropriate format. For example, the compressed representation of the data may be numerically represented as binary data.

Figure 4:
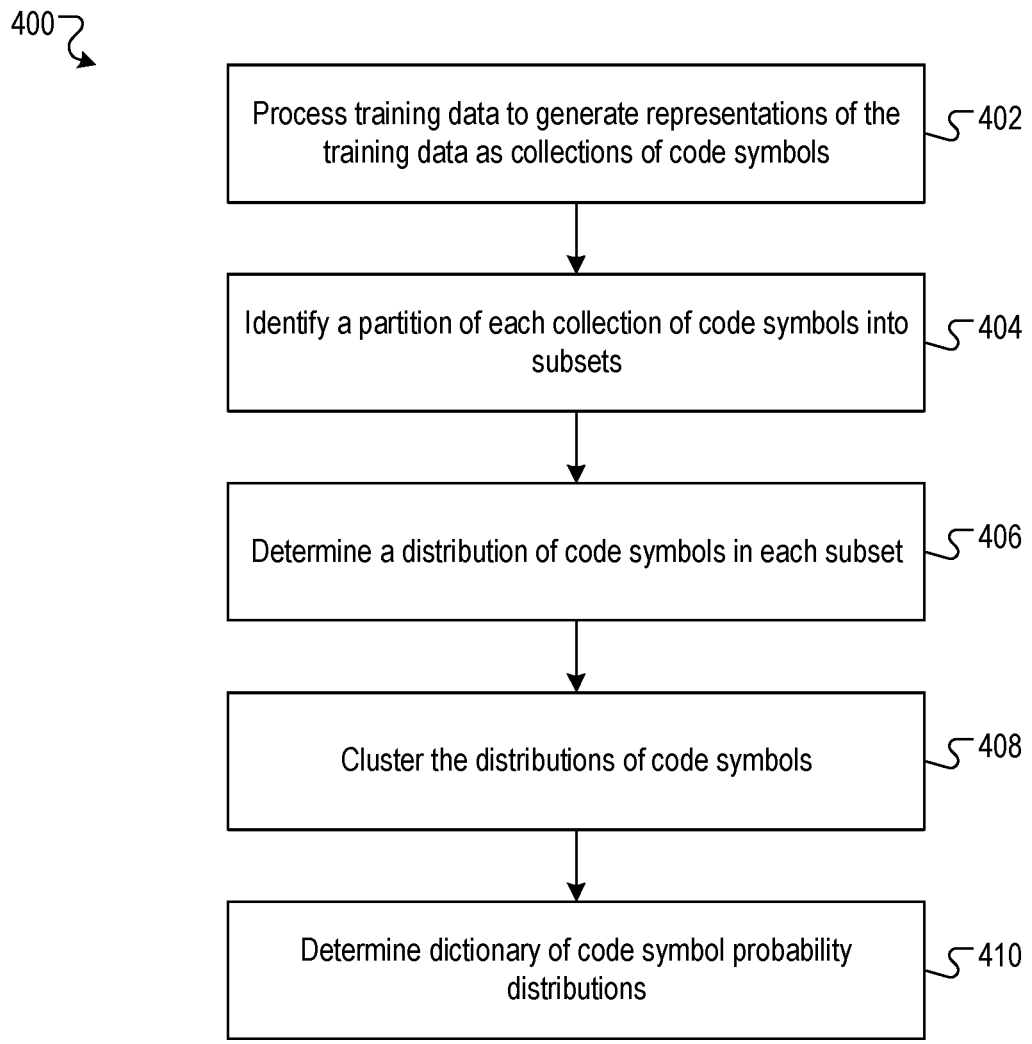
FIG. 4 is a flow diagram of an example process for determining a dictionary of code symbol probability distributions from a set of training data.

FIG. 4 is a flow diagram of an example process for determining a dictionary of code symbol probability distributions from a set of training data. For convenience, the process 400 will be described as being performed by a system of one or more computers located in one or more locations. For example, an encoding system, e.g., the encoding system 100 of FIG. 1, appropriately programmed in accordance with this specification, can perform the process 400.

The system processes data included in a set of training data to generate ordered collections of code symbols representing the training data (402). The training data may be image data (e.g., including multiple different images), audio data (e.g., including multiple different audio fragments), or any other form of data. An example of generating ordered collections of code symbols to represent data is described with reference to 304.

The system identifies a respective partition of each collection of code symbols representing the training data into one or more code symbols subsets (404). An example of identifying a partition of a collection of code symbols into one or more code symbol subsets is described with reference to 306.

For each code symbol subset of each collection of code symbols representing the training data, the system determines a respective code symbol probability distribution representing the frequency of occurrence of code symbols in the code symbol subset (406). For example, if the set of possible code symbols is: {0, 1, 2, 3}, and a code symbol subset is given by: (0, 3, 1, 2, 2, 0, 1, 3), then the system may determine the code symbol probability distribution: (0.25, 0.25, 0.25, 0.25) for the code symbol subset.

The system clusters the set of code symbol probability distributions representing the frequency of occurrence of code symbols in the code symbol subsets determined from the training data (408). Clustering the set of code symbol probability distributions refers to grouping the code symbol probability distributions so that code symbol probability distributions in a same group are more similar than code symbol probability distributions in different groups. The system can use any appropriate clustering algorithm, such as a k-means clustering algorithm, an expectation-maximization clustering algorithm, or a neural network clustering algorithm. In a particular example, the system may use a k-means clustering algorithm, where the distance between probability distributions is computed by a divergence measure (e.g., the Kullback-Leibler divergence measure).

The system determines a dictionary (i.e., a set) of code symbol probability distributions based on the clustered code symbol probability distributions (e.g., as determined in 408) (410). For example, for each group of code symbol probability distributions determined by the clustering, the system may determine the probability distribution defined the cluster center as a code symbol probability distribution to be included in the dictionary. For a given group of code symbol probability distributions determined by the clustering, the probability distribution defined by the cluster center may be the average of the code symbol probability distributions included in the group.

Figure 5:
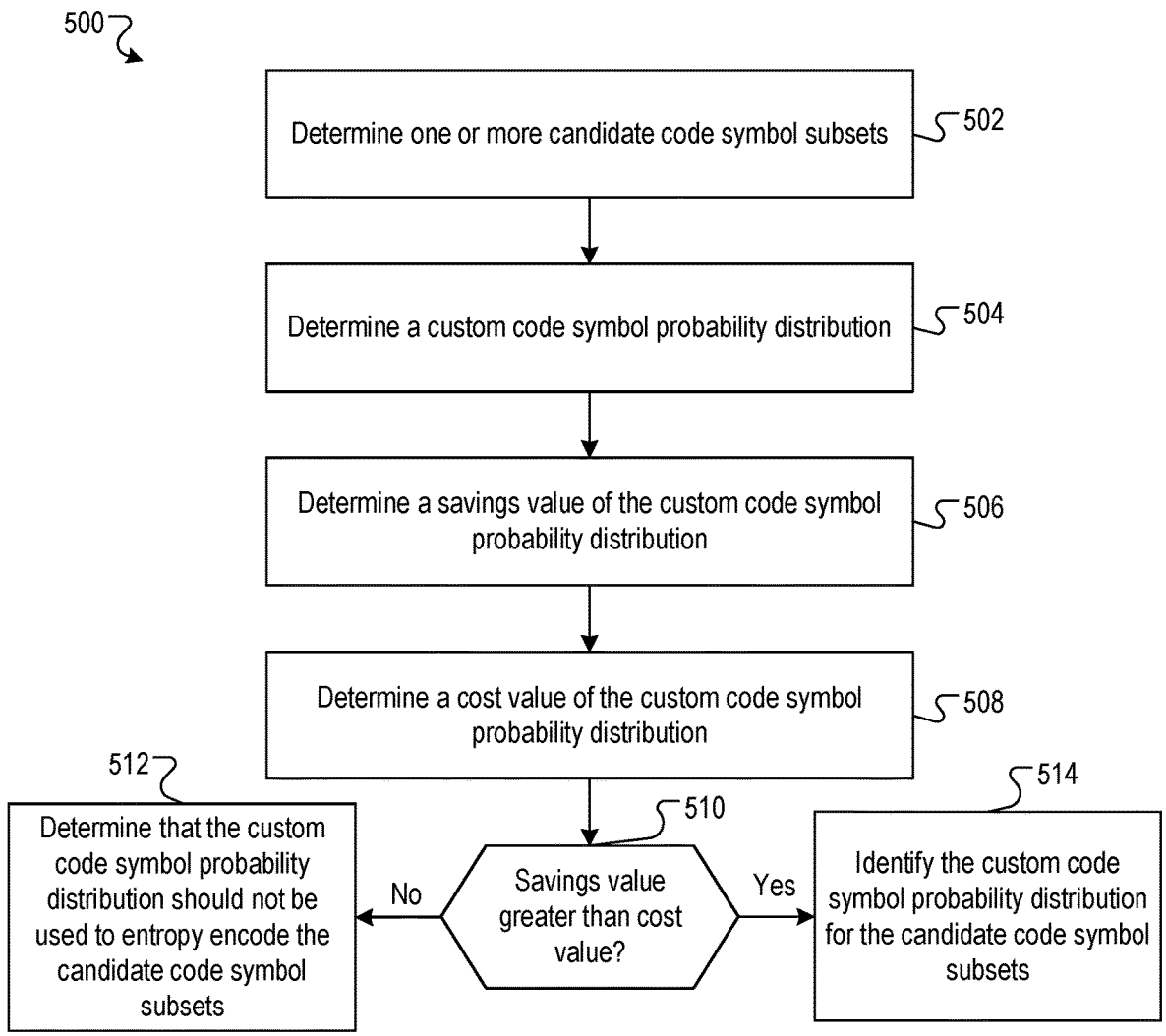
FIG. 5 is a flow diagram of an example process for identifying a custom code symbol probability distribution for one or more code symbol subsets.

FIG. 5 is a flow diagram of an example process for identifying a custom code symbol probability distribution for one or more code symbol subsets. For convenience, the process 500 will be described as being performed by a system of one or more computers located in one or more locations. For example, an encoding system, e.g., the encoding system 100 of FIG. 1, appropriately programmed in accordance with this specification, can perform the process 500. Generally, identifying custom code symbol probability distributions can be performed without the collection of code symbols being partitioned into multiple code symbol subsets.

The system determines one or more candidate code symbol subsets from the code symbol subsets representing the data to be compressed (e.g., as described with reference to 306). Each candidate code symbol subset is a candidate to be entropy encoded with respect to a custom code symbol probability distribution. The system may, for example, determine the candidate code symbol subsets to be those code symbol subsets which are determined to be poorly represented by the dictionary of code symbol probability distributions determined from the training data (e.g., as described with reference to FIG. 4). In this example, the system may determine that a code symbol subset is poorly represented by the dictionary of code symbol probability distributions if the following relationship is satisfied:

$$|L_{dic} - L_{true}| > \delta \cdot L_{dic} \tag{3}$$

where $\delta$ is a positive value (e.g., 0.5%, or any other value between 0 and 1), $L_{dic}$ is given by:

$$L_{dic} = -\sum_{j=1}^{n} \log p_{dic}(c_j) \tag{4}$$

where n is the number of code symbols in the code symbol subset and $p_{dic}(c_j)$ is the probability of the j-th code symbol in the code symbol subset according to the code symbol probability distribution identified from the dictionary (i.e., as described with reference to 308), and $L_{true}$ is given by:

$$L_{true} = -\sum_{j=1}^{n} \log p_{true}(c_j) \tag{5}$$

where $p_{true}(c_j)$ is the probability of the j-th code symbol in the code symbol subset according to the code symbol probability distribution reflecting the actual frequency of occurrence of code symbols in the code symbol subset.

The system determines a custom code symbol probability distribution based on the candidate code symbol subsets (e.g., as determined in 502) (504). For example, the system may determine the custom code symbol probability distribution to be an average of the code symbol probability distributions reflecting the actual frequencies of occurrence of code symbols in the candidate code symbol subsets (504).

The system determines a savings value achieved by entropy encoding the candidate code symbol subsets using the custom code symbol probability distribution rather than the code symbol probability distributions from the dictionary (506). For example, the system may determine the savings value based on a reduction in length (e.g., as measured in bits) of entropy encoded representations of the candidate code symbol subsets achieved by entropy encoding the candidate code symbol subsets using the custom code symbol probability distribution rather than the code symbol probability distributions from the dictionary.

The system determines a cost value of representing the custom code symbol probability distribution (508). For example, the system may determine the cost value based on a length of data (e.g., measured in bits) required to represent the custom code symbol probability distribution.

The system determines whether the savings value is greater than the cost value (510). In response to determining that the savings value is less than the cost value, the system may determine that the custom code symbol probability distribution should not be used to entropy encode (e.g., as described in 312) the candidate code symbol subsets (512). Conversely, in response to determining that the savings value is greater than the cost value, the system may identify the custom code symbol probability distribution for the candidate code symbol subsets (514). In this case, the candidate code symbol subsets are entropy encoded (as described with reference to 312) using the custom code symbol probability distribution rather than code symbol probability distributions from the dictionary.

Figure 6:
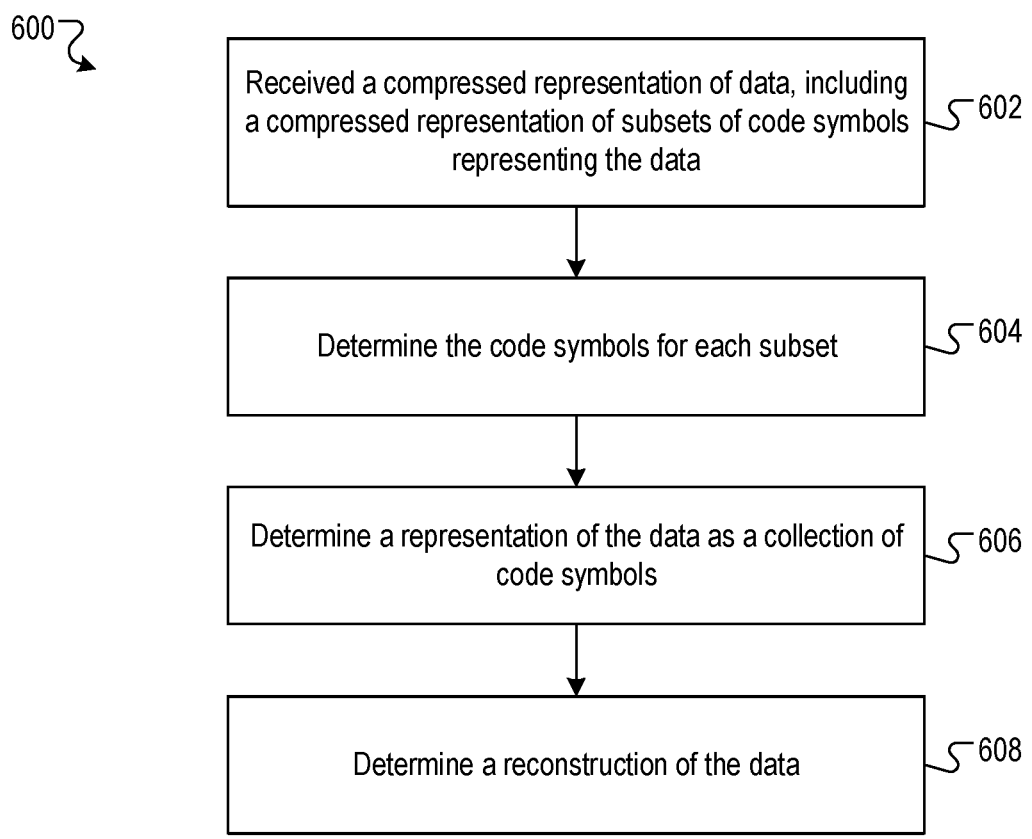
FIG. 6 is a flow diagram of an example process for determining a reconstruction of data from a compressed representation of the data.

FIG. 6 is a flow diagram of an example process for determining a reconstruction of data from a compressed representation of the data. For convenience, the process 600 will be described as being performed by a system of one or more computers located in one or more locations. For example, a decoding system, e.g., the decoding system 200 of FIG. 2, appropriately programmed in accordance with this specification, can perform the process 600.

The system receives a compressed representation of the data (e.g., the data compressed by an encoding system, as described with reference to FIG. 3) (602). The compressed representation of the data includes a compressed representation of each of one or more of the code symbol subsets representing the data (e.g., as described with reference to 306). The compressed representation of each code symbol subset may include: (i) an entropy encoded representation of the code symbol subset, and (ii) data indicating a code symbol probability distribution used to entropy encode the code symbol subset (e.g., as described with reference to 314). When the code symbol probability distribution used to entropy encode a code symbol subset is a custom code symbol probability distribution (e.g., as described with reference to FIG. 5), the compressed representation includes data which defines the custom code symbol probability distribution. For example, the compressed representation may include a vector with components that indicate a respective numerical probability value for each code symbol in the discrete set of possible code symbols according to the custom code symbol probability distribution.

For each compressed representation of a code symbol subset, the system determines the code symbol subset based on the code symbol probability distribution used to entropy encode the code symbol subset (604). For example, conditioned on the code symbol probability distribution used to entropy encode a code symbol subset, the system may determine a mapping between portions of the entropy encoded representation of the code symbol subset and corresponding code symbols. The system may use this mapping to determine the code symbol subset from the compressed representation of the code symbol subset.

The system determines the ordered collection of code symbols representing the data (e.g., as described with reference to 304) from the code symbol subsets (606). For example, the system may concatenate the code symbol subsets to determine the ordered collection of code symbols representing the data.

The system determines an (approximate or exact) reconstruction of the data based on the ordered collection of code symbols (608). For example, if the ordered collection of code symbols are the coefficients of a representation of the data with respect to a set of basis functions (e.g., the Fourier basis), then the system may determine a reconstruction of the data as a linear combination of the basis functions with coefficients given by the collection of code symbols. As another example, if the ordered collection of code symbols are the output of an encoder neural network, then the system may determine a reconstruction of the data by providing the collection of code symbols as an input to a decoder neural network. The decoder neural network is configured to process the collection of code symbols in accordance with current values of decoder neural network parameters to generate an output that defines a reconstruction of the data. In a particular example, if the encoder neural network is a convolutional neural network, then the decoder neural network may be a corresponding de-convolutional neural network.

This specification uses the term "configured" in connection with systems and computer program components. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

In this specification the term "engine" is used broadly to refer to a software-based system, subsystem, or process that is programmed to perform one or more specific functions. Generally, an engine will be implemented as one or more software modules or components, installed on one or more computers in one or more locations. In some cases, one or more computers will be dedicated to a particular engine; in other cases, multiple engines can be installed and running on the same computer or computers.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone that is running a messaging application, and receiving responsive messages from the user in return.

Data processing apparatus for implementing machine learning models can also include, for example, special-purpose hardware accelerator units for processing common and compute-intensive parts of machine learning training or production, i.e., inference, workloads.

Machine learning models can be implemented and deployed using a machine learning framework, e.g., a TensorFlow framework, a Microsoft Cognitive Toolkit framework, an Apache Singa framework, or an Apache MXNet framework.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a sub combination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

According to a first further aspect of the disclosure, there is provided a system for compressing data, the system comprising: an encoder neural network configured to perform operations comprising: receiving data to be compressed; processing the data in accordance with current values of a set of encoder neural network parameters to generate an output including a representation of the data as an ordered collection of code symbols; a compression subsystem configured to perform operations comprising: receiving the output of the encoder neural network, including the representation of the data as an ordered collection of code symbols; identifying a partition of the collection of code symbols into one or more code symbol subsets; for each code symbol subset: identifying, from a dictionary of multiple code symbol probability distributions, and based on the code symbol subset, a code symbol probability distribution for the code symbol subset; generating an entropy encoded representation of the code symbol subset by entropy encoding the code symbol subset using the code symbol probability distribution identified for the code symbol subset; determining a compressed representation of the code symbol subset, the compressed representation comprising: (i) the entropy encoded representation of the code symbol subset, and (ii) data indicating a code symbol probability distribution used to entropy encode the code symbol subset; determining a compressed representation of the data based on the compressed representations of the code symbol subsets.

According to a second further aspect of the disclosure, there is provided a computer-implemented method for compressing data, the method comprising: receiving data to be compressed; processing the data by an encoder neural network and in accordance with current values of a set of encoder neural network parameters to generate an output including a representation of the data as an ordered collection of code symbols; identifying a partition of the collection of code symbols into one or more code symbol subsets; for each code symbol subset: identifying, from a dictionary of multiple code symbol probability distributions, and based on the code symbol subset, a code symbol probability distribution for the code symbol subset; generating an entropy encoded representation of the code symbol subset by entropy encoding the code symbol subset using the code symbol probability distribution identified for the code symbol subset; determining a compressed representation of the code symbol subset, the compressed representation comprising: (i) the entropy encoded representation of the code symbol subset, and (ii) data indicating a code symbol probability distribution used to entropy encode the code symbol subset; determining a compressed representation of the data based on the compressed representations of the code symbol subsets.

Optionally in the first and/or second further aspect, the data to be compressed includes an image.

Optionally in the first and/or second further aspect, the encoder neural network is a convolutional neural network.

Optionally, the system of the first aspect further comprises a learning subsystem configured to perform operations comprising: processing data in a set of training data, by the encoder neural network and in accordance with the current values of the set of encoder neural network parameters, to generate outputs including representations of the data in the set of training data as ordered collections of code symbols; identifying, for each ordered collection of code symbols, a partition of the ordered collection of code symbols into one or more code symbol subsets; and determining the dictionary of multiple code symbol probability distributions based on distributions of code symbols in the code symbol subsets of the ordered collections of code symbols.

Optionally, the method of the second aspect further comprises processing data in a set of training data, by the encoder neural network and in accordance with the current values of the set of encoder neural network parameters, to generate outputs including representations of the data in the set of training data as ordered collections of code symbols; identifying, for each ordered collection of code symbols, a partition of the ordered collection of code symbols into one or more code symbol subsets; and determining the dictionary of multiple code symbol probability distributions based on distributions of code symbols in the code symbol subsets of the ordered collections of code symbols.

Optionally in the first and/or second further aspect, determining the dictionary of code symbol probability distributions comprises: determining, for each of the code symbol subsets of the ordered collections of code symbols, a respective code symbol probability distribution reflecting a frequency of occurrence of code symbols in the code symbol subset; clustering the determined code symbol probability distributions; and determining the dictionary of code symbol probability distributions based on cluster centers of the clustered code symbol probability distributions.

Optionally in the first and/or second further aspect, clustering the code symbol probability distributions comprises determining a distance between code symbol probability distributions based on a divergence measure.

Optionally in the first and/or second further aspect, identifying a code symbol probability distribution for the code symbol subset comprises: determining, for each code symbol probability distribution in the dictionary, a corresponding length of an entropy encoded representation of the code symbol subset based on the code symbol probability distribution; and identifying the code symbol probability distribution for the code symbol subset to be a code symbol probability distribution from the dictionary with a minimal corresponding length of entropy encoded representation.

Optionally in the first and/or second further aspect, determining the length of an entropy encoded representation of the code symbol subset based on the code symbol probability distribution comprises determining a sum, over each code symbol in the code symbol subset, of a logarithm of a probability of the code symbol according to the code symbol probability distribution.

Optionally, the operations performed by the compression subsystem of the first further aspect further comprise: determining one or more code symbol subsets to be candidate code symbol subsets; determining a custom code symbol probability distribution based on the candidate code symbol subsets; determining a savings value based on a reduction in a length of entropy encoded representations of the candidate code symbol subsets achieved by entropy encoding the candidate code symbol subsets using the custom code symbol probability distribution instead of code symbol probability distributions from the dictionary; determining a cost value based on a length of data required to represent the custom code symbol probability distribution; and in response to determining that the savings value is greater than the cost value, generating the entropy encoded representations of the code symbols of the candidate code symbol subsets by entropy encoding the candidate code symbol subsets using the custom code symbol probability distribution.

Optionally, the method of the second further aspect further comprises: determining one or more code symbol subsets to be candidate code symbol subsets; determining a custom code symbol probability distribution based on the candidate code symbol subsets; determining a savings value based on a reduction in a length of entropy encoded representations of the candidate code symbol subsets achieved by entropy encoding the candidate code symbol subsets using the custom code symbol probability distribution instead of code symbol probability distributions from the dictionary; determining a cost value based on a length of data required to represent the custom code symbol probability distribution; and in response to determining that the savings value is greater than the cost value, generating the entropy encoded representations of the code symbols of the candidate code symbol subsets by entropy encoding the candidate code symbol subsets using the custom code symbol probability distribution.

Optionally in the first and/or second further aspect, identifying a partition of the collection of code symbols into one or more code symbol subsets comprises identifying a partition of the collection of code symbols into multiple different proper subsets.

According to a third further aspect, the present disclosure provides a system for decompressing data, the system comprising: a decompression subsystem configured to perform operations comprising: receiving a compressed representation of data comprising a compressed representation of each of one or more code symbol subsets of an ordered collection of code symbols representing the data, wherein the compressed representation of a code symbol subset comprises: (i) an entropy encoded representation of the code symbol subset, and (ii) data indicating a code symbol probability distribution used to entropy encode the code symbol subset; determining each code symbol subset by decoding the entropy encoded representation of the code symbol subset based on the code symbol probability distribution used to entropy encode the code symbol subset; determining a representation of the data as an ordered collection of code symbols based on the code symbol subsets; and a decoder neural network configured to perform operations comprising: receiving the representation of the data as an ordered collection of code symbols determined by the decompression subsystem; processing the ordered collection of code symbols in accordance with current values of a set of decoder neural network parameters to generate an output defining a reconstruction of the data.

According to a fourth further aspect, the present disclosure provides a computer-implemented method comprising: receiving, by a decompression subsystem, a compressed representation of data comprising a compressed representation of each of one or more code symbol subsets of an ordered collection of code symbols representing the data, wherein the compressed representation of a code symbol subset comprises: (i) an entropy encoded representation of the code symbol subset, and (ii) data indicating a code symbol probability distribution used to entropy encode the code symbol subset; determining, by the decompression subsystem, each code symbol subset by decoding the entropy encoded representation of the code symbol subset based on the code symbol probability distribution used to entropy encode the code symbol subset; determining, by the decompression subsystem, a representation of the data as an ordered collection of code symbols based on the code symbol subsets; and processing, by a decoder neural network, the ordered collection of code symbols in accordance with current values of a set of decoder neural network parameters to generate an output defining a reconstruction of the data.

Optionally in the third and/or fourth further aspect, the data indicating a code symbol probability distribution used to entropy encode the code symbol subset comprises data indicating a code symbol probability distribution from a dictionary of code symbol probability distributions.

Optionally in the third and/or fourth further aspect, the data indicating a code symbol probability distribution used to entropy encode the code symbol subset comprises data defining a respective numerical probability value for each code symbol in a set of possible code symbols.

It will be recognized that the optional features of the first and second further aspect may also be applied to the third and fourth further aspects.

According to a fifth further aspect, the present disclosure further provides a non-transitory computer readable storage medium storing instructions executable by a data processing apparatus and that upon such execution causes the data processing apparatus to perform operations according to either the second or fourth further aspects.

What is claimed is:

1. A system for compressing data, wherein the system comprises one or more computers and one or more storage devices, wherein the one or more storage devices store:
   a plurality of predefined code symbol probability distributions, wherein each code symbol probability distribution defines a respective probability distribution over a set of possible code symbols; and
   instructions that when executed by the one or more computers cause the one or more computers to implement:
   an encoder neural network configured to perform operations comprising:
      receiving data to be compressed; and processing the data in accordance with current values of a set of encoder neural network parameters to generate an output including a representation of the data as an ordered collection of code symbols; and a compression subsystem configured to perform operations comprising:

receiving the output of the encoder neural network, including the representation of the data as an ordered collection of code symbols;

determining a partition of the collection of code symbols into a set of blocks;

for each of a plurality of blocks in the set:

selecting a respective predefined code symbol probability distribution from the plurality of predefined code symbol probability distributions for entropy encoding the block, comprising:

determining a respective score for each of the plurality of predefined code symbol probability distributions that characterizes a length of an entropy encoded representation of the block that would result from entropy encoding the block using the predefined code symbol probability distribution; and selecting the predefined code symbol probability distribution for entropy encoding the block based on the scores;

generating an entropy encoded representation of the block by entropy encoding the code symbols of the block using the code symbol probability distribution identified for the block;

determining a compressed representation of the block, the compressed representation comprising: (i) the entropy encoded representation of the block, and (ii) data indicating a code symbol probability distribution used to entropy encode the code symbols of the block; and determining a compressed representation of the data based on the compressed representations of the blocks.

2. The system of claim 1, wherein the data to be compressed includes an image.

3. The system of claim 1, wherein the encoder neural network is a convolutional neural network.

4. The system of claim 1, wherein the instructions, when executed by the one or more computers, further cause the one or more computers to implement a learning subsystem configured to perform operations comprising:

processing data in a set of training data, by the encoder neural network and in accordance with the current values of the set of encoder neural network parameters, to generate outputs including representations of the data in the set of training data as ordered collections of code symbols;

determining, for each ordered collection of code symbols representing the training data, a partition of the ordered collection of code symbols into a set of blocks; and determining the plurality of predefined code symbol probability distributions based on distributions of code symbols in the blocks of the ordered collections of code symbols representing the training data.

5. The system of claim 4, wherein determining the plurality of predefined code symbol probability distributions comprises:

determining, for each of the blocks of the ordered collections of code symbols representing the training data, a respective code symbol probability distribution reflecting a frequency of occurrence of code symbols in the block;

clustering the determined code symbol probability distributions; and determining the plurality of predefined code symbol probability distributions based on cluster centers of the clustered code symbol probability distributions.

6. The system of claim 5, wherein clustering the code symbol probability distributions comprises determining a distance between code symbol probability distributions based on a divergence measure.

7. The system of claim 1, wherein determining the respective score for each of the plurality of predefined code symbols probability distributions comprises, for each predefined code symbol probability distribution:

determining the respective score for the predefined code symbol probability distribution as a sum, over each code symbol in the block, of a logarithm of a probability of the code symbol according to the predefined code symbol probability distribution.

8. The system of claim 1, wherein:

the operations performed by the compression subsystem further comprise:

determining one or more blocks in the set to be candidate blocks;

determining a custom code symbol probability distribution based on the candidate blocks;

determining a savings value based on a reduction in a length of entropy encoded representations of the candidate blocks achieved by entropy encoding the candidate blocks using the custom code symbol probability distribution instead of code symbol probability distributions from the plurality of predefined code symbol probability distributions;

determining a cost value based on a length of data required to represent the custom code symbol probability distribution; and in response to determining that the savings value is greater than the cost value, generating the entropy encoded representations of the code symbols of the candidate blocks by entropy encoding the candidate blocks using the custom code symbol probability distribution.

9. A system for decompressing data, wherein the system comprises one or more computers and one or more storage devices, wherein the one or more storage devices store:

a plurality of predefined code symbol probability distributions, wherein each code symbol probability distribution defines a respective probability distribution over a set of possible code symbols; and instructions that when executed by the one or more computers cause the one or more computers to implement:

a decompression subsystem configured to perform operations comprising:

receiving a compressed representation of data comprising a respective compressed representation of each block in a set of blocks of code symbols that form a partition of a representation of the data as an ordered collection of code symbols, wherein the compressed representation of each block comprises: (i) an entropy encoded representation of the code symbols of the block, and (ii) data indicating a code symbol probability distribution used to entropy encode the code symbols of the block;

wherein for each of a plurality of blocks in the set of blocks, the code symbol probability distribution used to entropy encode the code symbols of the block was selected from the plurality of predefined code symbol probability distributions by operations comprising:
  determining a respective score for each of the plurality of predefined code symbol probability distributions that characterizes a length of an entropy encoded representation of the block that would result from entropy encoding the block using the predefined code symbol probability distribution; and
  selecting the predefined code symbol probability distribution for entropy encoding the block based on the scores;
determining the code symbols of each block by decoding the entropy encoded representation of the block based on the code symbol probability distribution that was used to entropy encode the code symbols of the block; and
determining a representation of the data as an ordered collection of code symbols based on the blocks; and
a decoder neural network configured to perform operations comprising:
  receiving the representation of the data as the ordered collection of code symbols determined by the decompression subsystem; and
  processing the ordered collection of code symbols in accordance with current values of a set of decoder neural network parameters to generate an output defining a reconstruction of the data.

10. The system of claim 9, wherein the data indicating the code symbol probability distribution used to entropy encode the code symbols of the block comprises data defining an index of a predefined code symbol probability distribution from the plurality of predefined code symbol probability distributions.

11. The system of claim 9, wherein the data indicating the code symbol probability distribution used to entropy encode the code symbols of the block comprises data defining a respective numerical probability value for each code symbol in a set of possible code symbols.

12. A computer-implemented method for compressing data, the method comprising:
  receiving data to be compressed;
  processing the data by an encoder neural network and in accordance with current values of a set of encoder neural network parameters to generate an output including a representation of the data as an ordered collection of code symbols;
  determining a partition of the collection of code symbols into a set of blocks;
  for each of a plurality of blocks in the set:
    selecting a respective predefined code symbol probability distribution from a plurality of predefined code symbol probability distributions for entropy encoding the block, comprising:
      determining a respective score for each of the plurality of predefined code symbol probability distributions that characterizes a length of an entropy encoded representation of the block that would result from entropy encoding the block using the predefined code symbol probability distribution; and
      selecting the predefined code symbol probability distribution for entropy encoding the block based on the scores;
    generating an entropy encoded representation of the block by entropy encoding the code symbols of the block using the code symbol probability distribution identified for the block;
    determining a compressed representation of the block, the compressed representation comprising: (i) the entropy encoded representation of the block, and (ii) data indicating a code symbol probability distribution used to entropy encode the code symbols of the block;
  determining a compressed representation of the data based on the compressed representations of the blocks.

13. The computer-implemented method of claim 12, wherein the data to be compressed includes an image.

14. The computer-implemented method of claim 12, wherein the encoder neural network is a convolutional neural network.

15. A non-transitory computer readable storage medium storing:
  a plurality of predefined code symbol probability distributions, wherein each code symbol probability distribution defines a respective probability distribution over a set of possible code symbols; and
  instructions that when executed by one or more computers cause the one or more computers to perform operations for compressing data, the operations comprising:
  receiving data to be compressed;
  processing the data by an encoder neural network and in accordance with current values of a set of encoder neural network parameters to generate an output including a representation of the data as an ordered collection of code symbols;
  determining a partition of the collection of code symbols into a set of blocks;
  for each of a plurality of blocks in the set:
    selecting a respective predefined code symbol probability distribution from the plurality of predefined code symbol probability distributions for entropy encoding the block, comprising:
      determining a respective score for each of the plurality of predefined code symbol probability distributions that characterizes a length of an entropy encoded representation of the block that would result from entropy encoding the block using the predefined code symbol probability distribution; and
      selecting the predefined code symbol probability distribution for entropy encoding the block based on the scores; generating an entropy encoded representation of the block by entropy encoding the code symbols of the block using the code symbol probability distribution identified for the block;
    determining a compressed representation of the block, the compressed representation comprising: (i) the entropy encoded representation of the block, and (ii) data indicating a code symbol probability distribution used to entropy encode the code symbols of the block;
  determining a compressed representation of the data based on the compressed representations of the blocks.

16. The non-transitory medium of claim 15, wherein the data to be compressed includes an image.

17. The non-transitory medium of claim 15, wherein the encoder neural network is a convolutional neural network.

18. The system of claim 1, wherein for each of the plurality of blocks in the set, selecting the predefined code symbol probability distribution for entropy encoding the block based on the scores comprises:
   selecting the predefined code symbol probability distribution having a score corresponding to a minimal length of entropy encoded representation of the block.

19. The computer-implemented method of claim 12, wherein for each of the plurality of blocks in the set, selecting the predefined code symbol probability distribution for entropy encoding the block based on the scores comprises:
   selecting the predefined code symbol probability distribution having a score corresponding to a minimal length of entropy encoded representation of the block.

20. The non-transitory computer readable storage medium of claim 15, wherein for each of the plurality of blocks in the set, selecting the predefined code symbol probability distribution for entropy encoding the block based on the scores comprises:
   selecting the predefined code symbol probability distribution having a score corresponding to a minimal length of entropy encoded representation of the block.

* * * * *